United States Patent [19]

Glasheen

[11] Patent Number: 4,864,869
[45] Date of Patent: Sep. 12, 1989

[54] FLOWMETER WITH FARADAY EFFECT OPTICAL SWITCH READOUT

[75] Inventor: William M. Glasheen, Derry, N.H.

[73] Assignee: General Electric Co., Schenectady, N.Y.

[21] Appl. No.: 141,369

[22] Filed: Jan. 4, 1988

[51] Int. Cl.⁴ .............................................. G01F 1/82
[52] U.S. Cl. .............................. 73/861.35; 731/861.77
[58] Field of Search ........... 73/861.35, 861.02, 861.03, 73/861.77, 861.79

[56] References Cited

U.S. PATENT DOCUMENTS

| | | | |
|---|---|---|---|
| 3,232,110 | 2/1966 | Li | 73/861.35 |
| 3,575,052 | 4/1971 | Lenker | 73/861.35 |
| 3,604,265 | 9/1971 | Wilson | 73/861.35 |
| 3,722,279 | 3/1973 | Jablonski | 73/861.35 |
| 4,056,976 | 11/1977 | Hildebrand | 73/861.35 |

Primary Examiner—Joseph A. Orsino
Assistant Examiner—Hollis T. Chen
Attorney, Agent, or Firm—I. D. Blumenfeld

[57] ABSTRACT

A flowmeter with an optical pick-off includes a turbine and a swirl generating impeller having magnets mounted on their periphery. Positioned on the exterior of the flowmeter housing in line with the magnets are monolithic Faraday effect optical switches. Each time the magnets pass by its associated Faraday switch the switch is actuated to produce an output pulse.

8 Claims, 2 Drawing Sheets

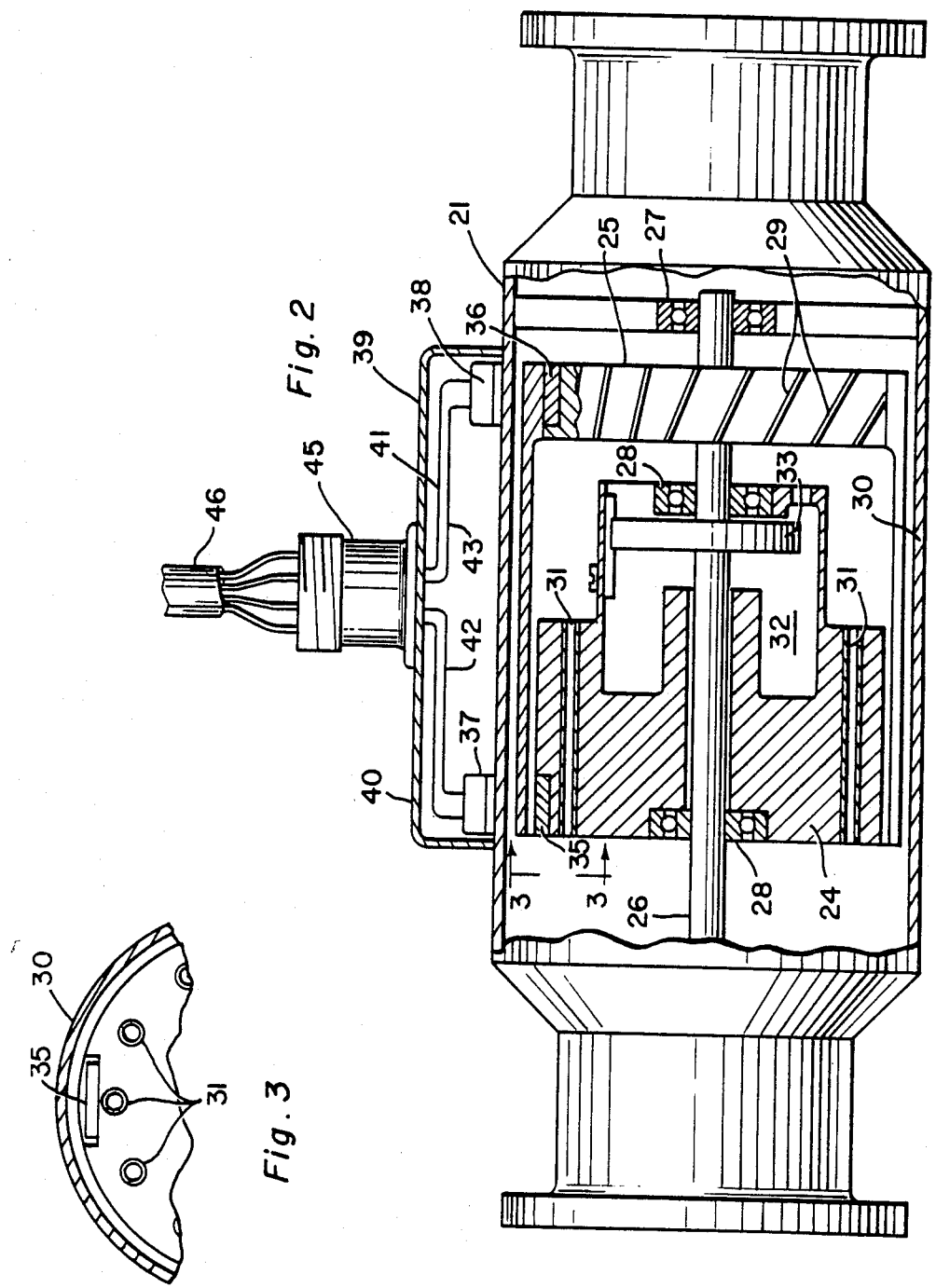

FLOWMETER WITH FARADAY EFFECT OPTICAL SWITCH READOUT

SUMMARY OF THE INVENTION

This invention relates to a flowmeter with an optical readout. More particularly, it relates to a flowmeter utilizing a Faraday effect optical switch which is selectively activated by magnetic elements on the flowmeter rotating elements.

BACKGROUND OF THE INVENTION

A recently filed application, Ser. No. 117,174 filed Nov. 5, 1987 in the name of William Michael Glasheen entitled: "Monolithic Faraday Optical Switch" assigned to the General Electric Company, the assignee of the instant invention, describes a monolithic Faraday effect optical switch. The monolithic switch contains all of the functional elements; viz, polarizers, analyzers, Faraday rotator layers, the light reflecting surface on a single substrate.

Briefly, the monolithic Faraday effect optical switch described in the above identified application is constructed with Faraday rotating layer(s) deposited on an optically inactive substrate. A polarizer-analyzer pair is deposited in a side-by-side arrangement on one side of the substrate over a Faraday rotator layer. A non-magnetic reflecting surface is deposited on the other side of the substrate. Radiation from an input optical fiber is transmitted through the polarizer element, through the Faraday rotational layer (s) and the optically inactive substrate to the reflecting surface where it is reflected back to the analyzer element. Being a Faraday effect device The plane of polarization of the incident radiation is rotated in the Faraday layers whenever the layer is subjected to a magnetic field. The presence of the magnetic field controls passage of light through the monolithic element thus performing the optical switching function. Because all of the functional components of the optical switch are deposited on a single substrate, a very small, miniaturized Faraday optical switching element is made possible.

Flowmeters which utilize magnetic elements positioned on the turbine and/or on the swirl generating impeller elements of the flowmeter as well known. Reference is hereby made to U.S. Pat. No. 4,301,276 issued Dec. 3, 1983 for a showing of such an arrangement. In such flowmeters mass flow is measured by measuring the time differential necessary for the magnetic elements to move through the displacement angle $\theta$ between the turbine and impeller or swirl generating elements; which displacement angle is a function of the fluid torque exerted on the turbine element by rotational velocity or angular momentum of the liquid being measured. Hitherto, large, and bulky sensing coils mounted on the housing of the flowmeter were used to output signal whenever the magnets passed and came into flux exchange relationship with the coil. Such arrangement were, as pointed out above, bulky and costly. A need therefore exists for a small, light weight flowmeter pick-off thereby reducing the size and weight of the flowmeter. Size and weight consideration are of great importance where mass flowmeters are utilized in aircraft, for example, where weight and size are at a premium.

Applicant has found, that the size and weight of the flowmeter arrangement may be substantially reduced by providing an optical pick-off for the flowmeter which utilizes a monolithic Faraday effect magneto-optical switch.

It is therefore a principal objective of the invention to provide a flowmeter utilizing a Faraday effect optical switch pick-off.

A further objective of the invention is to provide a flowmeter utilizing a monolithic, optical switch pick-off.

Still another objective of the invention is to produce a small, light weight flowmeter utilizing a Faraday optical switch readout.

Yet another objective of the invention is to provide a flowmeter using a Faraday effect optical switch readout which all of the functional elements of the Faraday switch are mounted on a single substrate.

Other objectives and advantages of the invention will become readily apparent as the description thereof proceeds.

BRIEF DESCRIPTION OF THE INVENTION

The various objectives and advantages of the invention are realized in an arrangement in which a mass flowmeter has magnets mounted on the periphery of the turbine and impeller swirl generating element. Mounted on the housing of the flowmeter and aligned with the magnets are monolithic Faraday optical switches. Each time a magnet passes by the switch and comes into flux exchange relationship with the switch, the magnetic field rotates the plane of polarization of an incident light beam so that the light passes through the switch thereby generating an output pulse. Because the magnet mounted on the turbine element lags the magnet on the impeller by an angle $\theta$ representative of the mass flow, the time interval between the two pulses is a measure of the mass flow rate of the fluid through the flowmeter.

BRIEF DESCRIPTION OF DRAWING

FIG. 2 is a partially broken away showing of the flowmeter having the Faraday optical readout switches mounted thereon.

FIG. 3 is a partial end view of the turbine along lines 3—3 of FIG. 2.

DETAILED DESCRIPTION OF THE INVENTION

Figure 1:
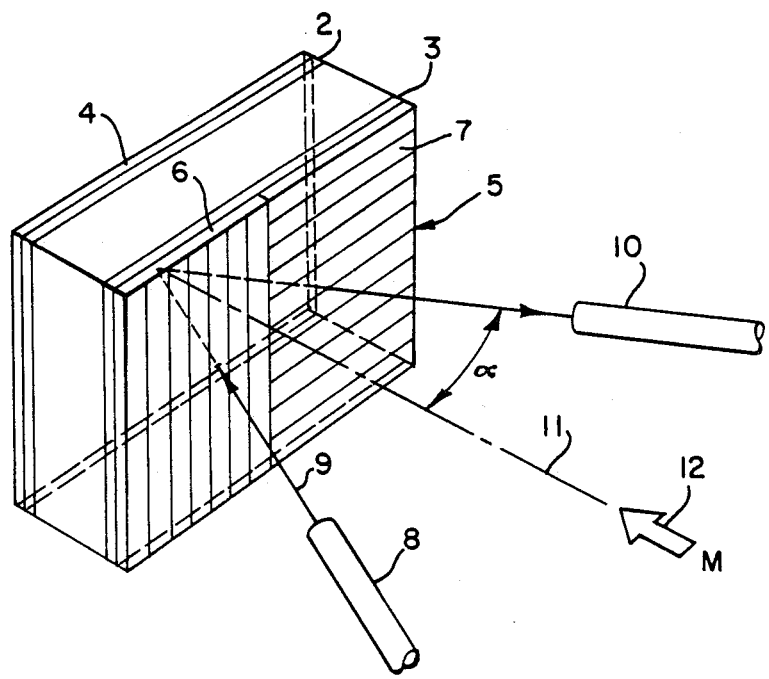
FIG. 1 is a perspective view of the monolithic Faraday optical switch element and illustrates the unique characteristics thereof.

The monolithic optical switch of FIG. 1 includes an optically inactive substrate 1 which is preferably a single crystal substrate of gadolinium gallium garnet though other mixed crystal garnet substrates may be used with equal effectiveness. The term "optically inactive" is used in the sense that the substrate is transparent to plane polarized light and does not affect the plane of polarization. Positioned on opposite sides of optically inactive garnet substrate 1 are Faraday rotator layers 2 and 3. Rotator layers 2 and 3 are preferably bismuth doped gadolinium garnet layers which are grown on the substrate by liquid phase epitaxy so that the rotator layers have the same crystalline orientation as the garnet substrate. That is, the growth of the bismuth doped gadolinium crystal structure is oriented by the crystal structure of the garnet substrate. Layers 2 and 3 are Faraday rotators in that the plane of polarization of radiant energy passing through such a layer in a direction parallel to a magnetic field, is rotated by an amount dependent on the Verdet constant of the layer and on the thickness of the layer. The Verdet constant of bismuth doped gadolinium Faraday rotators is very high. Angular rotations of one (1)° degree per micron of thickness for magnetic field intensities of 203 Gauss for 850 nanometer light have been achieved so that 90° rotation of the incident plane polarized radiation is possible with rotator thickness of roughly 90 microns.

A non-magnetic light or radiation reflecting layer 4 (of silver or aluminum, for example) is deposited over Faraday rotator 2. Deposited on the front surface of the substrate over rotator layer 3 in a polarizer pair shown generally at 5 which preferably consists of a pair of crossed elements mounted in a side-by-side configuration to control radiant energy transmission as a function of a magnetic field. Polarizing pair 5 thus consists of a polarizer element 6 shown as a vertical polarizer which permits passage of vertically plane polarized light whereas analyzer element 7 positioned adjacent to polarizer 6 is oriented to permit passage of horizontally polarized light. The polarizer elements in the side-by-side configuration are deposited over rotator 3 by well-known deposition techniques.

The Faraday optical switch is illuminated by a beam of radiant energy—the term radiant energy is used in its broadest sense to include electromagnetic energy both in and outside of the visible spectrum. The radiant energy comes from an input optical fiber 8 which is positioned adjacent to polarizer 6. Input fiber 8 is typically 100 micron core diameter optical fiber with the customary reflective and cladding layers, etc. Input fiber 8 is positioned to illuminate polarizer element 6 with the radiation illustrated by arrow 9. Input fiber 8 as well as output fiber 10 positioned adjacent to analyzer 7 are displaced from a normal or orthogonal axis 11—which axis represents the axis of the applied magnetic field 12—by an angle $\alpha$.

Vertically plane polarized light 9 exiting from polarizer 6 passes through Faraday rotator layer 3 and substrate 1 to Faraday layer 2. After passing through layer 2 the light is reflected from layer 4 back through the rotator layers and the substrate to analyzer 7. Plane polarized radiation which is rotated by 90° as shown by arrow 13 passes through analyzer 7, to output fiber 10 and is transmitted to remotely relocated detectors and signal processing electronics to produce an output signal which is an indication of the condition represented by the presence of the magnetic field.

If the degree of rotation is less than 90° only a portion of the incident radiation is horizontally polarized and only a portion of the incident energy passes through analyzer 7. That is, in the absence of a magnetic field the plane of polarization of the incident radiation is not rotated so that all of the reflected radiation is blocked by crossed analyzer 7. In the presence of a magnetic field, the incident radiation is rotated so that some of the radiation illuminating the back of analyzer 7 is now horizontally polarized and all, or a substantial portion thereof passes through the analyzer and is received by output optical fiber 10.

Optically inactive crystalline substrates of gadolinium gallium garnet having rotator layers of bismuth doped gadolinium are available from various sources such as Airtron Division of Litton Industries of 200 E. Hanover, Avenue, Morris Plains, N.J. 07950 under its trade designation LLC 120. The LLC 120 substrate/rotator is approximately 0.5 millimeters thick and has 21.7 micron thick layers of the bismuth doped gadolinium on each surface. The actual composition of LLC 120 is:

$$(Bi_{1.09}Tm_{0.07}Gd_{0.95}Y_{0.90})(Fe_{3.91}Ga_{0.76}Y_{0.30}Tm_{0.02})O$$

It has been found that the Faraday rotator layers of LLC 120 produce a rotation of 1.4° per micron when subject to a magnetic field of 203 Gauss and illuminated by light at 632 nanometers; and 3.6° of rotation per micron for light at a wave length of 546 nanometers. Thus for a Faraday rotator thickness layer of 21.7 microns the construction of FIG. 1 polarized energy passes through each rotator layer twice, once directly and again after being reflected by reflecting surface 4. It thus passes through a total Faraday rotator thickness of 86.8 microns; i.e., resulting in a rotation in excess of 90°.

A LCC 120 polarization rotator was tested at a wave length of 850 nanometers and each rotator layer produced a rotation of 1° per micron. Thus, in passing through the 21.7 micron layer 4 times the vertically polarized incident energy is rotated by 87° so that virtually all of it passes through analyzer 7. Obviously, by adjusting the thicknesses of Faraday rotator layers, for any offset angle $\alpha$, 90° rotation of polarized light may be easily achieved. Thus a very small, (less than 1 millimeter thick,) monolithic optical switch is provided in which all of the functional elements of a Faraday optical switch are mounted on a single substrate. As will be described subsequently in connection with FIGS. 2 and 3 such a Faraday optical switch element is useful as the optical pick-off/readout element for a flowmeter thereby eliminating the bulky and complex pickoff windings presently used with various types of flowmeters.

FIG. 2 is an exemplary illustration of a flowmeter utilizing a magneto optic pickoff which incorporates a monolithic Faraday optical switch of the type described in FIG. 1. The flowmeter of FIG. 2 is shown generally at 20 and includes a housing 21 (partially broken away) of a non-magnetic material such as stainless steel having an inlet end 22 and an outlet end 23. A turbine 24 and an impeller swirl generator 25 are secured in housing 21 and are mounted on a shaft 26 which is journaled at both ends on suitable ball bearings 27. Ball bearings 27 are shown at the downstream end, with the bearings on which the other end of shaft is journaled not being shown.

Turbine 24 is journaled on shaft 26 by means of ball bearings 28. Swirl generator 25, on the other hand, is secured directly to shaft 26. Impeller 25 has a main body portion with a plurality of skewed vanes 29. The impact of the fluid on the vanes imparts an angular viscosity to the fluid and to the swirler. Since impeller 25 is affixed to a shaft 26, rotation of the impeller causes the shaft to rotate at an angular velocity governed by the vane angles. Impeller 25 also contains a cylindrical shroud 30 extending from the periphery which is concentric with and surrounds turbine 24. Thrust bearings, not shown, space the turbine and impeller/swirler along the shaft and are positioned respectively between the turbine and the rotor.

A plurality of fluid passages in the form of tubes 31 are distributed around the periphery of turbine 24. Turbine 24 also contains a re-entrant portion 32 on the down stream side. One end of a helical spring 33 is secured to the inner wall of the re-entrant portion 32 and the other end of the spring is secured to shaft 26. In effect impeller 25 and turbine 24 constitute two rotating elements joined by the torque resistant spring. While the two will rotate at the same rate, the phase difference due to the field torque is a function of the mass rate of flow.

Secured on the periphery of turbine 24 and impeller/swirl generator 25 are magnets 35 and 36 which have their north-south mounted axes along a cord of the cylindrical turbine and impeller elements (as may be seen more clearly in FIG. 3). As fluid passes through the flowmeter, the swirler impeller 25 imparts an angular velocity to the impeller shaft and turbine combination. The angular acceleration of the incoming fuel through the tubes in turbine 24 cause the turbine to displace angularly relative to the shaft to cause torque applied by the fluid to the turbine to deflect restraining spring 33 relative to the shaft. The spring deflects through some angle $\theta$ until the spring torque equals fluid torque.

Measurement of mass flow, i.e., the measurement of the angular displacement turbine 24 with respect to impeller 25, is achieved through the medium of the magnets 35 and 36 as they rotate in response to the fluid flow. A pair of Faraday effect optical switches 37 and 38 are positioned in a housing 39 mounted on main flowmeter housing 21. Faraday optical switches 37 and 38, which are the type illustrated in FIG. 1 are aligned (in the vertical plane) with magnets 35 and 36 mounted on the periphery of the turbine and of the impeller. Faraday optical switches in the magneto-optic pickoff transmit light to produce an output signal upon passage of magnets 35 and 36 since their magnetic field causes rotation of the plane of polarization of light impinging on the switches from the input optical fibers 40 and 41. This results in passage of the light to output optical fibers 42 and 43; with the optical fibers being brought out of the housing 39 through the connector 45 and then through an optical cable 46 to remote signal processing electronics which produce electrical pulses in response to the light transmitted through the output fiber.

The flow of the liquid as it passes through the turbine has a change of angular momentum which is equal to the fluid torque acting on the turbine and is given by:

$$t_T = \omega M r^2 \quad (1)$$

$t_T$ = fluid torque acting on the turbine
$\omega$ = angular velocity of turbine shaft
$M$ = mass flow rate
$r$ = average radius of gyration of turbine flow passages The torque applied by fluid on turbine acts to deflect the restraining spring relative to the shaft. The spring deflects through some angle $\theta$ such that the spring torque equals the fluid torque. This spring torque is given by:

$$t_s = K\theta \quad (2)$$

Where:
$t_s$ = Spring torque
$K$ = Spring constant
$\theta$ = Angle of the deflection of the turbine relative to the shaft.

Applying Newtons Second Law, a balance of torques on the turbine leads to:

$$t_s = t_T \quad (3)$$

Substituting Equation 1 and 2 into 3 yields;

$$\theta = \frac{\omega M r^2}{K} \quad (4)$$

Thus, for a given geometry, the angle of deflection of the turbine relative to the shaft is a function of both turbine speed and mass flow rate. Rather than measuring the angular displacement $\theta$ of the spring directly, the optical pickoff of Faraday switch measures the time required for reference points on the turbine as represented by magnets 39 and 40 to move through the displacement angle $\theta$ between the turbine and the impeller. Angle $\theta$ can be determined by measuring the elapsed time between the signal represented by passage of magnet on impeller 24 past its optical switch and the signal produced by the passage of the magnet on turbine 24 past its optical switch. Thus:

$$\theta = \omega \Delta T \quad (5)$$

Where:
$\omega$ = turbine and shaft angular velocity
$\Delta T$ = elapsed time
Combining Equation (4) and (5) yields:

$$M = \frac{K \Delta T}{r^2} = K' \Delta T \quad (6)$$
$$= K' = \frac{K}{r^2}$$

The mass flow rate through the flowmeter is then directly proportional to the time difference between the impeller pulse and the turbine pulse. The flowmeter scale factor $K'$ is a function of the fixed geometry of flowmeter as a physical characteristic of the restraining spring. Since the scale factor is constant through all operating conditions of the flowmeter and from one flowmeter to another, the time differential thus becomes an accurate measure of the mass flow through the turbine.

FIG. 3 is a partial end view of turbine 24 along the lines of 3—3 the upstream side of the turbine shows the shroud 30 extending from impeller 25 and concentric with turbine 24. Magnet 35 is mounted on the turbine. The north-south axis of magnet lies along a radius of the cylindrical turbine. A plurality of tube elements 31 pass through the turbine and are disposed in an annular configuration.

As will now be apparent, a small light weight flowmeter construction has been illustrated in which the mass flow rate is determined by measuring the time interval required for a reference point represented by a magnet to move through the displacement angle $\theta$ between the turbine and the impeller. The pickoff device is for measuring this angle the electro optic pickoff utilizing a monolithic Faraday optical switch which is actuated by the passage of magnets and its associated magnetic field. That is, when the magnets come into flux exchange relationship with each of the Faraday optical switches rotation of light impinging on the optical switches take place thereby permitting passage of light through the optical switch. Passage of this light generates electrical pulse which represents the time of passage with the time interval between the passage of the magnets on the turbine and impeller thereby becoming a measure of the mass flow rate of the fluid to the flowmeter.

While the instant invention has been described in connection with a preferred embodiment thereof, the invention itself is by no means limited thereto since many modifications in the instrumentalities employed may be made without departing from the true spirit and scope of the invention.

What is claimed as the invention and desired to be secured by United States Letters Patent is:

1. A mass rate flowmeter with an optical pick-off comprising:
   (a) A flowmeter housing for receiving a fluid stream the mass flowrate of which is to be measured;
   (b) Rotating turbine and swirl imparting elements mounted in said housing;
   (c) the fluid stream causing said rotating elements to be angularly displaced with respect to each other as a function of the mass rate of flow of said fluid;
   (d) Optical pick-off means for measuring the angular displacement between said rotating elements including
      (1) source of magnetic flux mounted on each of said rotating elements;
      (2) A source of radiant energy positioned outside of said housing;
      (3) Faraday effect optical switch means mounted on said housing, means to bring said radiant energy to said housing to illuminate the Faraday effect optical switch means, each of such sources of magnetic flux on said rotating elements being in alignment with said switch means;
      (4) said optical switch means being actuated when said source of magnetic flux on each of said rotating elements comes into flux relationship with said switch means to permit passage of said radiant energy through said switch means, the time interval necessary for said magnetic flux sources to come into flux exchange relationship with the switch means being a measure of mass rate of flow of said fluid.

2. The flowmeter according to claim 1, wherein said Faraday effect optical switch means contains individual Faraday switches, each of which contains all of the switch elements on a single radiant energy transmitting substrate.

3. The flowmeter according to claim 2 wherein said optical switch means contains Faraday rotator layers and polarizer and analyzer elements deposited on said substrate.

4. The flowmeter according to claim 3 wherein each of said Faraday effects switches has an input optical fiber positioned to illuminate the polarizer element on said substrate and an output optical fiber positioned to receive radiant energy passed by the analyzer element whereby radiant energy from the input fiber passes through said switch to said output fiber when the magnetic flux source mounted on the associated rotating element comes into flux exchange relationship with said Faraday optical switches.

5. The flowmeter according to claim 1 wherein one of said rotating elements is angularly restrained and the angular momentum of said fluid causes said angular restrained element to move angularly until the fluid torque exerted on said restrained element equals the angular restraining torque whereby the sources of magnetic flux on said rotating elements are angularly displaced by an amount proportional to the mass flow rate.

6. The flowmeter according to claim 5 wherein said Faraday effect optical switch means of a monolithic construction and contains switch elements on a single light transmissive substrate.

7. The flowmeter according to claim 6 wherein said monolithic optical switch contains the Faraday rotators, polarizers and analyzers on said single substrate.

8. The flowmeter according to claim 7 wherein an input optical fiber is positioned to illuminate the polarizer with a beam of radiant energy and an output fiber positioned adjacent to said analyzer whereby passage of the source of magnetic flux by said switch causes transmission of radiant energy from said input fiber through said switch to said output fiber.

* * * * *